United States Patent [19]

Yiu et al.

[11] 4,187,464
[45] Feb. 5, 1980

[54] SCANNING RECEIVER

[75] Inventors: Joseph T. Yiu; Jeffrey G. Lea, both of Lincoln; Roy L. Holmes, Lexington, all of Nebr.

[73] Assignee: Hy-Gain de Puerto Rico, Inc., Lincoln, Nebr.

[21] Appl. No.: 815,577

[22] Filed: Jul. 14, 1977

[51] Int. Cl.² .............................................. H04B 1/32
[52] U.S. Cl. ................................................. 325/470
[58] Field of Search ............... 325/470, 334, 468, 469, 325/464, 459, 453, 457, 471, 462, 336, 478, 335; 334/11, 18, 16

[56] References Cited
U.S. PATENT DOCUMENTS

| | | | |
|---|---|---|---|
| 3,801,914 | 4/1974 | Imazeki | 325/470 |
| 3,821,651 | 6/1974 | Fathauer et al. | 325/470 |
| 3,919,646 | 11/1975 | Morgan | 325/470 |
| 3,999,131 | 12/1976 | Fukuda | 325/453 |
| 4,020,479 | 4/1977 | Caspari et al. | 325/470 |
| 4,075,567 | 2/1978 | Klank | 325/457 |

OTHER PUBLICATIONS

SBE, Opti*Scan, Printed 8/1976.

Primary Examiner—John C. Martin
Assistant Examiner—Tommy P. Chin
Attorney, Agent, or Firm—Vincent L. Carney

[57] ABSTRACT

To lock out certain channels in a scanning receiver, a counter in the scanning control circuit is manually stepped to the channel to be locked out and a signal is recorded in a memory at that point by depressing a switch while the memory is addressed by the circuitry which causes scanning. When the scanning circuit thereafter reaches the same channel, the address of that channel causes a readout from the memory which electronically inhibits the scanning of the locked-out channel. With minor modification, the circuitry may accommodate other electrically recorded switching operations such as band switching operations and priority operations.

17 Claims, 9 Drawing Figures

SCANNING RECEIVER

This invention relates to scanning receivers and more particularly relates to scanning receivers in which certain channels are locked out of the scanning operation.

In one class of scanning receiver, the scanning circuitry includes a counter, a pulse generator, an array of crystal circuits, and certain oscillator circuitry, with each crystal circuit being independently connectable in circuit with the same oscillator circuitry at different times to form a series of different crystal controlled oscillators. In the alternative, the scanning circuitry includes a frequency synthesizer with a programmable counter that controls the frequency generated by the frequency synthesizer so that a plurality of different discrete frequency signals can be selected. In either alternative, the different frequency signals are applied to the first mixers of the receiver to select incoming signals.

When a carrier frequency is received on one of the frequencies being scanned in this manner, the RF mixer provides a signal which is processed by the IF and audio stages of the receiver, resulting in a signal to the speaker and to the squelch control circuit, with the squelch control circuit providing a signal that terminates the scanning.

In a prior art type of scanning receiver of this class, lockout switches are provided to lock out certain channels from the scanning operation. In the alternative, the selected channel may be skipped and not scanned at all.

The prior art arrangements which use switches to lock out circuits have several disadvantages, such as: (1) the switches are expensive; (2) the switches are subject to contact wear and therefore must at times be replaced; (3) a substantial amount of power is needed to provide signal levels that make adequate contact through the switches; and (4) the switches are relatively large and increase the size of the scanning receiver. The embodiment in which channels are skipped is relatively complex, expensive, and inflexible.

Accordingly, it is an object of the invention to provide a novel scanning receiver.

It is a further object of the invention to provide a scanning receiver having an inexpensive lockout system.

It is a still further object of the invention to provide a scanning receiver having a channel lockout system which may be used for other switching operations in the circuit.

It is a still further object of the invention to provide a scanning receiver having a lockout system which is relatively reliable.

It is a still further object of the invention to provide a scanning receiver having a channel lockout system which does not require individual manually-operated switches for each channel nor a circuit for skipping the scanning of certain circuits.

In accordance with the above and further objects of the invention, a scanning receiver includes a scanning circuit which during scanning energizes a frequency generating circuit to generate a plurality of discrete frequencies in sequence. The receiver includes: (1) a memory which is addressable in accordance with the channel being scanned by the scanning circuit; (2) a circuit for manually writing and erasing channel lockout signals in the memory; and (3) a circuit for automatically reading the lockout signal when present on the channel being scanned and inhibiting the receiver from locking on the locked-out channel.

To record a lockout signal, the scanning circuit is manually or automatically stepped to the channel to be locked out and a lockout signal recorded in the memory. When the channels are automatically scanned thereafter to generate a different discrete frequency for each channel, the lockout signal inhibits the reception of signals on that channel. The lockout signal may be erased by manually stepping to the locked-out channel and erasing the lockout signal by energizing and write/erase circuit. The memory and switching arrangements may be advantageously used for purposes other than a lockout channel to achieve further economy such as for band switching operations, priority operations and the like.

Advantageously, the memory is a random access memory and the scanning circuit includes a binary counter which drives a decoder. The decoder energizes selected separate channels. As the binary counter counts clock pulses in the scanning operation, the random access memory is addressed by the outputs of the binary counter. In manual operation, signals may be written into the memory corresponding to manually selected channels to indicate if the channel is to be locked out or not to be locked out.

From the above description, it can be understood that the lockout circuit of this invention has the advantages of being inexpensive, reliable, using low power and being relatively small in size.

The above noted and other features of the invention will be better understood from the following detailed description when considered with reference to the accompanying drawings in which:

GENERAL STRUCTURE

Figure 1:
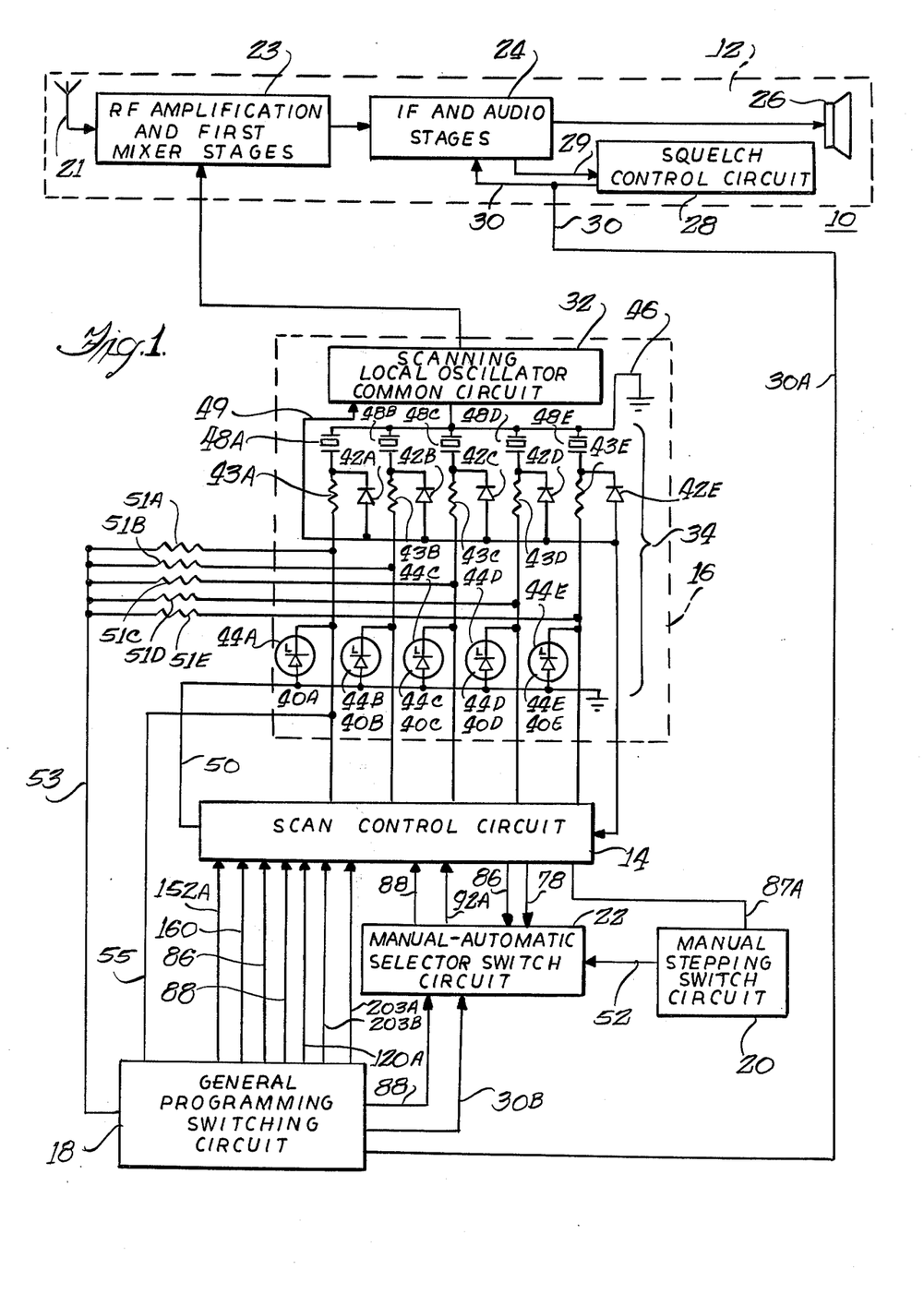
FIG. 1 is a partly-schematic, partly-block diagram of a scanning receiver in accordance with the embodiment of the invention.

In FIG. 1, there is shown a scanning receiver 10 having a basic receiving section 12, a scan control circuit 14, a scanning local oscillator 16, a general programming switching circuit 18, a manual stepping switch circuit 20, and a manual-automatic selector switch circuit 22.

The scanning local oscillator 16 is electrically connected to: (1) the basic receiving section 12 to which it applies a plurality of different frequency signals; and (2) the scanning control circuit 14 which controls the selection of the different channels. The scan-control circuit 14 is electrically connected to: (1) the manual-automatic selector switch circuit 22 to permit continuous scanning; (2) the manual-automatic selector switch 22 through the manual stepping switch circuit 20 to permit stepping from channel to channel manually; and (3) the general programming switching circuit 18 which locks out and establishes priority for certain channels of the scanning local oscillator 16.

To receive radio signals and provide audio information, the basic radio section 12 includes an antenna 21, RF amplification and first mixer stages 23, IF and audio stages 24, a speaker 26 and a squelch control circuit 28, with the RF amplification and first mixer stages 23 being connected to the antenna 21 to receive modulated carrier frequencies which are amplified and mixed with signals from the local oscillator and applied to the IF and audio stages 24 for further amplification and transmission to the speaker 26. A squelch circuit 28 is connected to the discriminator within the IF and audio stages 24 through a conductor 29 to provide squelch control and to develop a signal on conductor 30 when a carrier is received.

To enable the scanning receiver 10 to scan across a plurality of discrete frequencies until it receives a modulated carrier, the scanning local oscillator 16 includes a scanning local oscillator common circuit 32, and a discrete-frequency signal-generating array 34. The scan control circuit 14 is connected to different conductors in the discrete-frequency signal-generating array 34 to energize different ones of said members of said array in succession and thus to cause the scanning local oscillator 16 to apply a succession of different local oscillation frequencies to the mixer in the RF amplification and mixer stages 23.

To cause the scan control circuit 14 to automatically scan frequencies in succession, the manual-automatic selector switch circuit 22 is electrically connected to the scan control circuit 14 through a conductor 92A. In the manual mode, pulses are applied to the scan control circuit only when a manual stepping switch (not shown in FIG. 1) in the manual stepping circuit 20 is activated. To inhibit scanning when a carrier signal is received, the manual-automatic selector circuit 22 is connected to the conductor 92A and inhibits the application of pulses to the scan-control circuit 14 upon receipt of a signal on conductor 30B.

The general programming switching circuit 18 is electrically connected to the scan control circuit 14 by conductors 152A, 160, 86, 88, and 203B to the scan control circuit so as to apply signals thereto to indicate channels which are to be locked out, or selected as priority channels or for other switching operations.

To provide a succession of different discrete frequencies to the RF amplification and first mixer stages 23 of the basic radio receiver portion 12, the discrete-signal generating array 34 includes a plurality of channels, five channels 40A-40E being shown in FIG. 1 for purposes of explanation. Each of the channels is connected at one end to a different output of the scan-control circuit 14 and at the other end to the input of the scanning local oscillator common circuit 32, the output of the scanning local oscillator common circuit 32 being connected to an input of the mixer within the RF amplification and first mixer stages 23.

Each of the channels 40A-40E includes: (1) a corresponding one of the lamps 44A-44E to indicate the frequency being provided to the mixer in the RF and first mixer stages 23; (2) a corresponding one of the crystals 48A-48E to cause the scanning local oscillator common circuit 32 to provide the selected discrete frequency; (3) a corresponding one of the diodes 42A-42E; and (4) a corresponding one of the resistors 43A-43E.

In each of the channels 40A-40E, the corresponding one of the resistors 43A-43E and corresponding one of the crystals 48A-48E are connected in series in the order named between a corresponding one of the outputs of the scan control circuit 14 and a conductor 46 which is electrically grounded. Each of the diodes 42A-42E has its cathode electrically connected between corresponding ones of the resistors 43A-43E and corresponding crystals 48A-48E, with all of their anodes being electrically connected to an input of the scanning local oscillator common circuit 32 through a conductor 49 and to the scan control circuit.

Each of the lamps 44A-44E has its cathode electrically connected to a different one of the outputs of the scan control circuit 14 in a corresponding one of the channels 40A-40E and has its anode electrically connected to a conductor 50 which is electrically connected to the scan control circuit 14 at one end and to ground through a capacitor at its other end. For certain design reasons related to the impedance of the diodes 42, they may be connected in two parallel groups to the scanning local oscillator common circuit through the forward resistance of two other diodes (not shown). The scanning local oscillator common circuit is conventional circuitry that forms a different crystal controlled oscillator with each of the crystals 48 as scanning progresses in a manner known in the art.

In the preferred embodiment, the lamps 44A-44E are LED (light emitting diode) lamps, having their anodes connected to the conductor 50 which is connected within the scan control circuit to certain band switching circuits where it performs switching operations and having their cathodes connected to the output of the scanning control circuit 14 so that the selected channel, by grounding the selected cathode of the lamp, completes a circuit through the lamp, causing it to be illuminated to indicate the selected channel.

Each of the channel 40A-40E outputs of the scan control circuit 14 is electrically connected through a corresponding one of the resistors 51A-50E to one end of a conductor 53, the other end of conductor 53 being electrically connected to a positive source of potential within the general programming circuit 18. The output of the scan control circuit 14 for the first channel is electrically connected through a conductor 55 to a special switch for maintaining a priority on this channel under certain conditions. Other priority establishing circuitry is within the scan control circuit 14.

GENERAL OPERATION

Before operating the scanning receiver 10, the crystals 48A-48E are selected and inserted in the discrete-frequency signal-generating array 34. The crystals are selected to cooperate with the scanning local oscillator common circuit 32 so that each crystal causes the scanning local oscillator common circuit 32 to oscillate at one predetermined frequency. The crystals, and thus the frequencies, are selected in accordance with the geographic area in which the scanning receiver is being used. For example, in certain geographic areas a frequency of 174 megahertz is used by certain emergency vehicles so that a police scanning receiver includes one of the crystals 48 which, when energized together with the scanning local oscillator common circuit 32 resonates at 174 megahertz.

After the crystals have been selected and inserted, certain of the channels 40A-40E are selected to be locked out of the circuit so that signals on the frequencies corresponding to those channels will not be received. This locking out of channels is temporary and may be changed at any time in accordance with the needs of the user.

To lock out a given one of the channels 40A-40E, the user switches the manual-automatic selector switch circuit 22 into the manual position. If the scanner is not on the selected channel, it may be manually stepped to this channel by further manipulation of the manual-automatic selector switch circuit 22. With the manual-automatic selector switch circuit 22 in the manual position, the manual switch in the manual stepping switch circuit 20 is depressed. Each time the manual stepping switch circuit 20 is depressed, the scan control circuit 14 moves to a successive channel of the channels 40A-40E. For example, if channel 40A is energized to cause reception of signals corresponding to that channel, the depressing of the switch once de-energizes that channel and energizes the channel 40B to apply a different local frequency to the first mixer in the RF amplification and first mixer stages 23.

The depressing and releasing of the manual stepping switch circuit 20 is continued until the channel to be locked out is energized. While this channel is energized, the general programming switching circuit 18 is depressed and this causes logic circuitry in the scan control circuit 14 to inactivate the particular channel during scanning in the automatic mode. For example, if channel 40B is energized when the general programming switching circuit 18 is depressed, channel 40B is de-energized.

Channels which have been de-energized are connected in the circuit by manually stepping the scan control circuit 14 to the locked-out channel in the same manner as it was stepped to the channel earlier and energizing the general programming switching circuit 18. This re-energizes the channel.

Other operations are programmed in a similar manner to be performed when a selected channel is reached by the scanning operation. For example, to establish a priority, the scan-control circuit is stepped to the channel which is to have priority as explained above and a signal is applied to conductor 86. Thereafter, when a signal is applied to conductor 88 to establish the priority mode of operation, the selected channel will be a priority channel to which the scan-control circuit 14 returns after an interruption. The prior selection may be changed by stepping the scan-control circuit 14 back to a newly selected priority channel and applying a pulse to conductor 160 which establishes the new priority channel and erases the old priority. Also, certain programmed operations, associated with a specific channel may be provided by hand wiring the program as will be explained hereinafter in connection with certain other hand switching operations.

In operation, the scanning local oscillator 16 provides a succession of different discrete frequencies to the RF amplification and first mixer stages 23 and the RF amplification and first mixer stages 23 receive any carrier frequencies that are present from antenna 21. When an audio-modulated carrier frequency is received corresponding to a discrete frequency applied to the mixer in the RF amplification and first mixer stages 23, it is detected and applied to the IF and audio stages 24, which processes it to provide an audio signal to the speaker 26 and a signal to the squelch circuit 28.

Upon receipt of a signal indicating an audio signal, the squelch circuit 28 provides a signal to the manual-automatic selector circuit 22 through conductor 30B to terminate the scan by inhibiting pulses applied to the scan control circuit 14, thus causing the signal to be continued to be applied to the speaker 26 as long as the carrier is modulated.

To generate the succession of discrete frequencies as the scan control circuit 14 steps from position to position, the scan control circuit 14 grounds one side of corresponding ones of the resistors 43A-43E so that the corresponding ones of the crystals 48A-48E are successively energized by the potential from the scanning local oscillator common circuit 32. The normal scan rate in the automatic mode is 1.4 hertz.

The energizing of one of the crystals 48A-48E completes a circuit through the local oscillator common circuit 32 to cause it to oscillate at a different frequency for each one of the crystals 48A-48E, thus providing a plurality of discrete frequencies to the RF amplification and first mixer stages 23 as the scan control circuit 14 steps from position to position, with those frequencies being inhibited for which the crystals have been locked out in the manner described above. The selected crystal is protected from voltage surges by the corresponding ones of the diodes 42A-42E which are electrically positioned across them the scanning local oscillator common circuit 32. The lamp 44A-44E corresponding to the selected channel is illuminated while that channel is scanned.

Channels may also be manually scanned by putting the selector switch in the manual-automatic selector switch circuit 22 in the manual position. When the manual-automatic selector switch circuit 22 is in the manual mode, instead of automatically scanning from position to position, the scan control circuit 14 does not scan unless a switch in the manual stepping switch circuit 20 is depressed. Each time it is depressed the scan control circuit 14 steps one position in the same manner as it automatically steps when the manual-automatic selector switch circuit 22 is in the automatic position.

To receive radio signals, the antenna 21 receives and applies signals to the first mixer through an RF amplifier within the RF amplification and first mixer stages, which mixer also receives discrete frequencies in succession from the scanning local oscillator common circuit 32 of the scanning local oscillator 16. The output from the mixer is then processed in a manner conventional in FM superheterodyne scanning receivers.

To hold or lock the scanning local oscillator 16 when a modulated carrier is received, the audio signal from the IF and audio stages 24 is applied to a squelch circuit 28 which: (1) turns on the audio amplifier to receive the incoming audio signal; and (2) applies a signal through conductor 30 to the manual stepping switch circuit 20 to prevent further scanning.

The scanning radio 10, of course, may be of any type such as the type that holds the position as long as the carrier is being received and continues scanning later or the type that locks in position upon the reception of the carrier manually until unlocked. Many such types of circuits are known in the art and a person skilled in the art can modify the basic circuit disclosed in FIG. 1 to provide for different types of circuits.

While in the preferred embodiment, the scanning receiver utilizes separate crystals, each of which corresponds to a different channel, it is possible to use a frequency synthesizer incorporating a smaller number of crystals to provide a larger number of frequencies. With this modification, the counter controls the operation of the frequency synthesizer rather than selecting individual crystals, but otherwise the circuit operates as described with respect to crystals except for necessary design modifications which are routinely made by persons skilled in the art.

If a priority channel has been set, a strobe pulse is periodically applied to that channel during scanning and during the time that the scanning receiver is locked into another channel. If a signal is received on the priority channel, the receiver will lock on it. A primary alert weather priority channel for weather alerts and the like may be set by closing a switch. When set, this channel will be strobbed as well but at a time out of phase with the normal priority channel mentioned earlier, assuming that a normal priority channel had been set. The alert weather priority will override the secondary or normal priority mentioned above and all other channels and become locked with a signal is received on the alert channel. This alert channel is arbitrarily always chosen to be the first channel in the preferred embodiment.

From the above description, it can be understood that the scanning receiver 10 has several advantages, many of which are primarily derived from the use of an electronic lockout rather than individual lockout switches. Some of these advantages are: (1) the electronic lockout is less expensive than individual mechanical switches; (2) the electronic circuits are more durable and less subject to wear; (3) the priority is easily adjusted; and (4) the electronic circuits are compatible with other switching operations which may be performed within the same radio receiver such as selecting different bands in the manner described in U.S. Pat. No. 3,940,697.

DETAILED STRUCTURE

Figure 2:
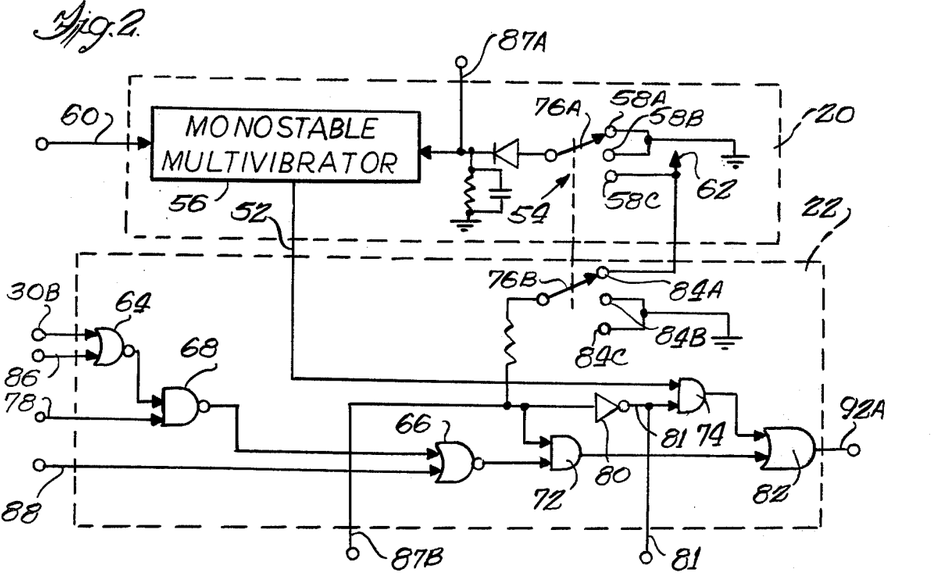
FIG. 2 is a schematic circuit diagram of one portion of the scanning receiver of FIG. 1.

In FIG. 2, there is shown a logic circuit diagram of the manual stepping switch circuit 20 and the manual-automatic selector switch circuit 22 connected electrically by a conductor 52 and mechanically by linkage connected poles of double-pole three-position switch 54. The switch 54 includes a first switch arm 76A for controlling manual stepping and a second switch arm 76B for selecting the manual or automatic mode of scanning. Conductor 52 applies stepping pulses for manual stepping from the manual stepping switch circuit 20 to the manual-automatic selector switch circuit 22.

To generate manual stepping pulses, the manual stepping switch circuit 20 includes a clocked monostable multivibrator 56, the switch arm 76A and three fixed contacts 58A, 58B, and 58C of double-pole three-position switch 54. The monostable multivibrator 56 is electrically connected to the switch arm 76A, conductor 52 and a conductor 60 through which it receives clock pulses. Contacts 58A and 58B are grounded and contact 58C is electrically connected to a source of positive potential 62 so that the clocked monostable multivibrator 56 applies a single pulse to conductor 52 only when switch arm 76A is closed against contact 58C and the first clock pulse is received on conductor 60. No pulses are applied to conductor 52 when switch arm 76A is closed to contacts 58A or 58B or when closed to 58C after the first clock pulse is received on conductor 60 resulting in one output pulse on conductor 52 for that closing of the switch arm 76A to contact 58C, the clocking to avoid spurious pulses from contact bounce causing stepping.

To select the manual or automatic mode of scanning, the manual-automatic selector switch circuit 22 includes first and second NOR gates 64 and 66, a NAND gate 68, first and second AND gates 72 and 74, an inverter 80, a NOR gate 82, the switch arm 76B and three stationary switch contacts 84A, 84B, and 84C.

To apply clock pulses to the scan control circuit 14 (FIG. 1) during automatic scanning or manually initiated pulses during manual scanning, conductor 92A (FIGS. 1 and 2) is electrically connected to the output of OR gate 82, one input of which is electrically connected to the output of AND gate 74 to receive individual pulses during manual scanning and the other input of which is electrically connected to the output of AND gate 72 to receive clock pulses during automatic scanning.

To apply pulses to the output of AND gate 74 for manual scanning, one of the two inputs to AND gate 74 is electrically connected through a conductor 81 to the output of inverter 80 the input of which is electrically connected to switch arm 76B so that: (1) when switch arm 76A is closed against either contact 58A or 58B and switch arm 76B is closed against either of contacts 84A or 84B, AND gate 74 is closed because conductor 52 is low; and (2) when switch arm 76A is closed against contact 58C and switch arm 76B is closed against contact 84C, one pulse is applied to the output of AND gate 74 because the gated monostable multivibrator 56 is triggered by the positive potential applied through switch arm 76A to apply a pulse to conductor 52 and a positive pulse is applied to AND gate 74 by the inverter 80 which receives a ground level potential from switch arm 76B.

To apply clock pulses to the output of AND gate 72, one of the two inputs to AND gate 72 is electrically connected to the output of NOR gate 66 and the other input is electrically connected to switch arm 76B so that; (1) when switch arm 76B is closed against either contacts 84A, or 84B, AND gate 72 is closed to clock pulses from NOR gate 66 by a ground level potential on one input from switch arm 76B; and (2) when switch arm 76B is closed against contact 84C, AND gate 72 is open to clock pulses from NOR gate 66.

To apply clock pulses to the output of NOR gate 66 in the absence of a squelch signal or a signal indicating programming, NOR gate 64 has: (1) one of its two inputs connected to conductor 30B to receive squelch signals; (2) the other input electrically connected to a conductor 86 to receive signals indicating the programming of a lockout bit; and (3) its output electrically connected to one of the two inputs of NAND gate 68 to apply a binary one thereto only in the absence of a squelch signal and the absence of a signal indicating programming of the lockout channels.

The other input of NAND gate 68 is electrically connected to conductor 78 to receive clock pulses and its output is electrically connected to one input of NOR gate 66, the other input being electrically connected to a conductor 88 which receives a positive signal indicating band programming so that positive pulses are applied to AND gate 72 only when no band programming is occuring and binary zero pulses are being applied to NOR gate 66 from NAND gate 68 indicating the absence of a squelch signal and the absence of lockout bit programming.

The switch 54 is biased so that: (1) it may be manually moved to a position where switch arms 76A and 76B contact fixed contacts 58A and 84A respectively and it remains in this position to permit clock pulses to be applied to conductor 92A from conductor 78 for scanning in the absence of a squelch signal on conductor 30B, a signal on conductor 86 indicating that the scanning receiver is in condition for programming lockout channels or a signal on conductor 88 indicating that the scanning receiver is in condition for band programming; (2) it may be manually moved to a position where switch arms 76A and 76B contact fixed contacts 58B and 84B respectively and it remains in this position to prevent clock pulses or individual scan pulses from being applied to conductor 92A so that scanning may be stopped by the operator at any channel by moving the switch 54 to this position when the indicator lamps 44A–44E (FIG. 1) indicate that the scanning ratio is scanning this channel; and (3) it may be manually moved to a position where switch arms 76A and 76B contact fixed contacts 58C and 84C respectively but it will return under the spring biasing to a position where switch arms 76A and 76B contact contacts 58B and 84B, thus causing one scanning pulse to be applied to conductor 92A to step the receiver one channel for each time the switch 54 is moved into this position.

In operation, when the scanning receiver 10 (FIG. 1) is not receiving a carrier frequency on a selected channel, the conductor 30B applies a ground level potential to the NOR gate 64, which applies a positive potential to the NAND gate 68. When the manual-automatic selector switch circuit 22 is in the automatic mode, positive pulses are applied to the conductor 78, causing the NAND gate 68 to apply ground level pulses to NOR gate 66 resulting in positive pulses being applied through AND gate 72 and OR gate 82 to the scan control circuit 14 (FIG. 1) through conductor 92A so that the scan control circuit 14 scans from channel to channel.

When a squelch signal to applied to conductor 30B, indicating that the scanning receiver 10 (FIG. 1) is receiving a carrier frequency on a selected channel, the NOR gate 64 applies a ground level signal to one of the inputs of the NAND gate 68, thus blocking clock pulses on conductor 78 from the conductor 92A and the scan control circuit 14 (FIG. 1), thus terminating the scanning operation until the carrier frequency is no longer being received.

When the manual-automatic selector switch circuit 22 is in its manual mode position, one input to AND gate 72 is grounded so that no clock pulses are applied to conductor 92A regardless of whether there is a squelch or no squelch signal being applied to the conductor 30B. In this position, the scan control circuit 14 (FIG. 1) does not scan. To make it scan one position manually, the operator presses the switch 54 so that switch arms 76A and 76B contact contacts 58C and 84C respectively through a switch on the panel to cause stepping from one position to the next.

Figure 3:
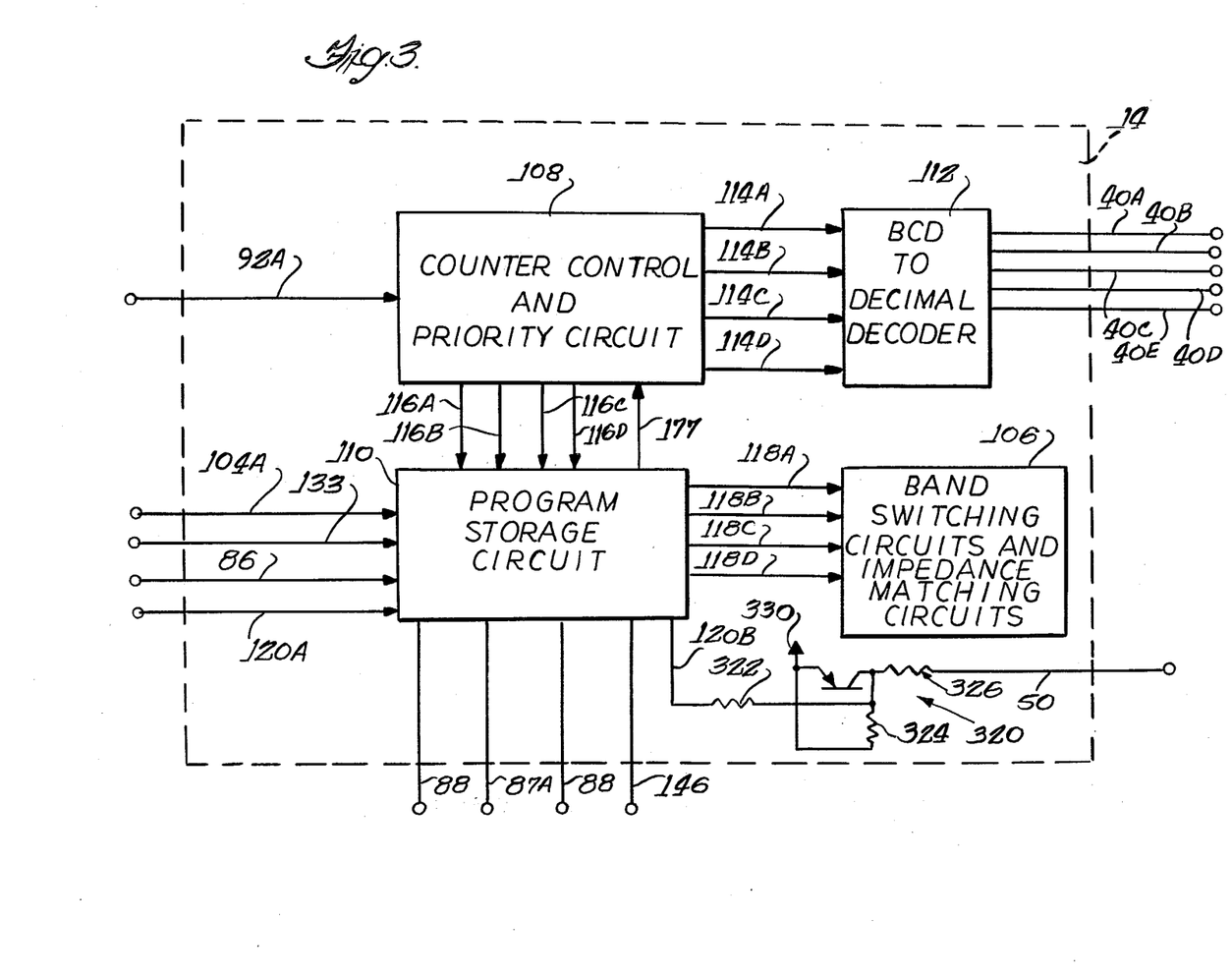
FIG. 3 is a block diagram of still another portion of the scanning receiver of FIG. 1.

In FIG. 3, there is shown a block diagram of the scan control circuit 14 having a band switching circuits and impedance matching circuits 106, a counter control and priority circuit 108, a program storage circuit 110 and a BCD to decimal decoder (binary coded decimal to decimal decoder) 112.

The program storage circuit 110 is electrically connected to conductors 104A, 133, 86, 120A, 88, 87A and 146 to receive data indicating the channels that are to be locked out and indicating which channels cause switching between different bands so as to incorporate different impedances or different RF amplifiers or the like in connection with the first mixer. Other switching operations can, of course, be stored as outputs applied as a substitute or in addition to the band switching circuits and impedance matching circuits 106.

The counter control and priority circuit 108 is electrically connected through conductor 87A to the manual stepping switch circuit 20 (FIG. 1) from which it receives: (1) clock pulses when the manual-automatic selector switch circuit 22 (FIG. 2) is in the automatic mode and there is no squelch signal; (2) single pulses when the manual-automatic switch circuit 22 is in the manual mode and the manual stepping switch is depressed. The counter control and priority circuit 108 applies binary coded information indicating the address of the channel being scanned to the BCD to decimal decoder 112 through the conductors 114A–114D and to the program storage circuit 110 through conductors 116A–116D.

The program storage circuit 110 is connected to the band switching circuits and impedance matching circuits 106 through conductors 118A–118D to perform certain logic operations consistent with the data stored therein and is connected to the general programming circuit 18 (FIG. 1) through conductor 120A to open the circuit channel of the scan control circuit being scanned and thus prevent reception of signals on that channel to lock out certain of the channels 40A–40E for which a lockout signal has been recorded in the program storage circuit 110 upon receipt of the address of that channel on conductors 116A–116D.

In the preferred embodiment the band switching circuits and impedance matching circuits 106 are controlled by signals in memory addressed by the counter control and priority circuit 108 as the channels are selected. However, if hardware programming rather than software is desired, the band switching circuits and impedance matching circuits 106 may be connected to the BCD to decimal decoder 112 and controlled by the outputs thereof in a manner known in the art.

Before operating the scanning receiver 10 (FIG. 1), data is read into conductor 104A indicating the channels that are to be locked out.

In operation, clock signals are applied through conductor 92A to the counter control and priority circuit 108 during scanning. The counter control and priority circuit 108 translates the signals into binary coded decimal form for application to: (1) the BCD to decimal decoder 112 through conductors 114A–114D; and (2) the program storage circuit 110 through conductors 116A–116D (FIG. 3).

To prevent scanning when a lockout pulse is applied to conductor 120B, the scan control circuit 14 includes a PNP transistor 320, having its base electrically connected to: (1) conductor 120B through a resistor 322; and (2) to its emittor through a resistor 324, the collector of transistor 320 being electrically connected to conductor 50 through a resistor 326 so that, a positive pulse on conductor 120B disconnects conductor 50 from the source of potential 330 and de-energizes the local oscillator until the next channel is scanned and the lockout bit removed.

The BCD to decimal decoder 112 decodes the binary coded decimal input signals received on conductors 114A–114D and applies a series of signals in decimal form to the channels 40A–40E. These signals control the frequency received and, in some embodiments, the input impedance to the mixer. Of course, as explained earlier, five channels are only shown by illustration and in the actual embodiment more or fewer channels may be utilized.

Figure 4:
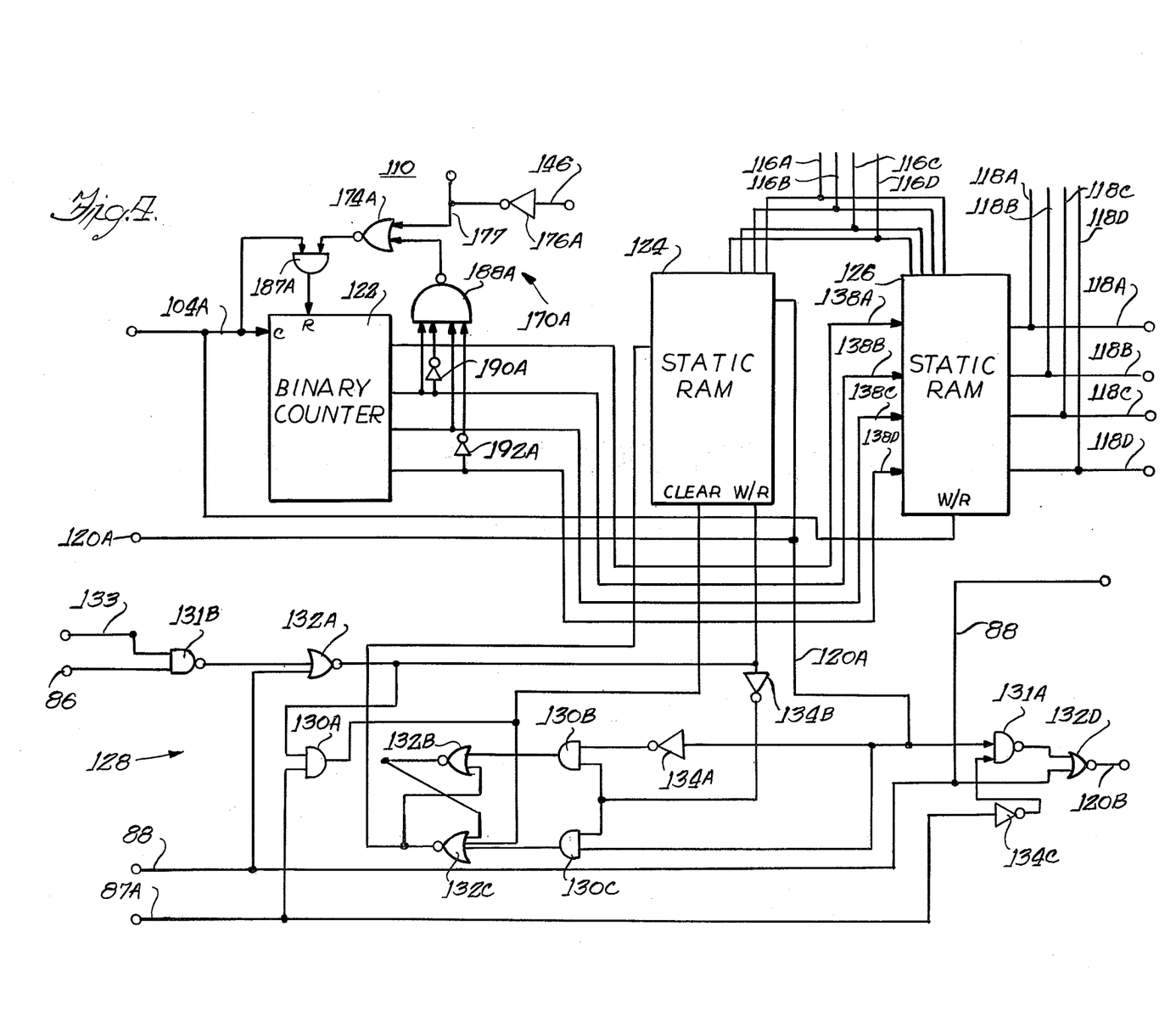
FIG. 4 is a block diagram of still another portion of the block diagram of FIG. 3.

In FIG. 4, there is shown a schematic diagram of the program storage circuit 110 having a binary counter 122, a first static RAM (random access memory) 124, a second static RAM 126 and a read/write gating circuit 128. The first static RAM 124 records and reads sixteen one-bit words which are used to indicate locked-out channels and the second static RAM 126 records sixteen four-bit words which are used to select bands for certain channels.

To receive information for recording in the second static RAM 126, the binary counter 122 is electrically connected to the conductor 104A. To enter an indication of a band selected for a particular channel, an appropriate number of pulses are applied to conductor 104A for recording in the binary counter 122 to indicate the channel or band.

To switch between sixteen channel and ten channel operation, the counter 122 is connected to a channel number control circuit 170A. To control the number of channels that are scanned, the channel number control circuit 170A includes a NOR gate 174A, a NAND gate 188A, an AND gate 187A and two inverters 190A and 192A. The NOR gate 174A has: (1) its output electrically connected to the reset terminal of the binary counter 122; (2) one input electrically connected to the output of NAND gate 188A to receive a signal from the outputs of the binary counter 122; and (3) its other input electrically connected to conductor 146 through the inverter 176A to receive an inverted signal when the channel capacity is to be changed.

To recognize when ten channels have been scanned, the NAND gate 188A has four inputs: (1) a first of which is connected to a conductor representing the first bit position; (2) a second of which is connected to the output of the inverter 190A, the input of which is connected to a conductor representing the second bit position; (3) a third of which is connected to a conductor representing the third bit position; and (4) a fourth of which is connected to the output of the inverter 192A, the input of which is connected to a conductor representing the fourth bit position. With these connections, the NAND gate 188A applies a pulse to one input of the NOR gate 174A upon recognition of the tenth channel on the outputs of binary counter 122. The output of NOR gate 174A is connected to one input of AND gate 187A, the other input of which is electrically connected to conductor 104A to apply an output pulse when a ten select pulse is on conductor 146, the tenth channel is recognized and a clock pulse is applied to conductor 104A. The output of AND gate 187A is electrically connected to the reset input of binary counter 122 to reset counter 122 to the first position on the count after the tenth count during the ten channel mode of operation. When there is no ten scan select the counter is automatically reset after sixteen counts.

To record information in the second static RAM: (1) a conductor 104A is electrically connected to the count input terminal of the binary counter 122 and to the W/R input terminal of static RAM 126; (2) channel address conductors 116A–116D are electrically connected to static RAM 126 to address it; and (3) data input conductors 138A–138D connect the outputs of binary counter 122 to the inputs of the static RAM 126.

With these connections the scanning receiver 10 is stepped to the channel to be programmed by applying pulses to the counter control and priority circuit 108 (FIG. 3). After the channel has been reached as indicated by the lamps 44A–44E (FIG. 1) the switch 54 (FIG. 2) is positioned with switch arms 76A–76B closed against contacts 58B and 84B respectively. The channel is now indicated in a counter (not shown in (FIG. 4) within the counter control and priority circuit 108 (FIG. 3) and scanning is stopped.

A pulse is applied to conductor 88 (FIG. 2) which prevents further scanning of the aforementioned counter with the counter control and priority circuit 108 (FIG. 2) but permits scanning within the program storage circuit 110 (FIGS. 3 and 4) by pulses applied from the counter control and priority circuit 108 to the binary counter 122. The scanning is indicated on the lamps 44A–44E (FIG. 1) as pulses and generated by moving the switch 54 (FIG. 2) to the manual scan position. Pulses are generated in this manner until the indicator lamps 44A–44E indicate the band selected for that channel.

The pulses are applied to the binary counter 122 over conductor 104A and the binary count is applied over conductors 138A–138D in binary form to the static RAM 126. These pulses are written into the static RAM by a signal applied from conductor 104A to the W/R input terminal of the static RAM 126 in a conventional way. This indication of the band is written at the channel address selected during the previous scanning of the counter and indicated by the output of conductors 116A–116D so that during normal automatic scanning the conductors 116A–116D address the static RAM 126 at each channel and read the band recorded thereon into conductors 118A–118D.

To cause an indication of locked-out channels to be recorded in an addressed location in the first static RAM 124, the read/write gating circuit 128 includes three AND gates 130A–130C, four NOR gates 132A–132D, two NAND gates 131A–131B, and three inverters 134A–134C.

To select the channel to be locked out, the static RAM 124 is electrically connected to conductors 116A–116D which address it as the scanning receiver 10 scans from position to position in a manner similar to the addressing of the static RAM 126 for band information. The static RAM 124 may be stopped at the selected address by moving the switch 54 to the position where the switch arm 76A–76B are in contact with the fixed contacts 56B and 84B.

To read a lockout bit to the counter control and priority circuit 108 to inhibit the addressed channel, the static RAM 124 includes an output conductor 120A which is connected directly to the counter control and priority circuit 108 and to one input of NAND gate 131A. The other input is electrically connected through the inverter 134C to conductor 87A which is a manual select band program conductor so that, when a ground level pulse is applied to conductor 87A indicating that band programming is not being done, a binary one is applied to one input of a NAND gate 131A, causing a binary one from the static RAM to result in a ground level or binary zero output and a binary zero to result in a binary one output.

The output of NAND gate 131A is electrically connected to one input of NOR gate 132D and the other input of NOR gate 132D is electrically connected to conductor 88 so that if a binary zero is applied from the output of NAND gate 131A indicating a locked-out channel and there is no band programming signal on conductor 88, the NOR gate 132D provides a binary one lockout bit to the counter control circuit 108 to inhibit scanning of the channel and if a binary zero is in the static RAM 124, the NOR gate 132D provides a binary zero output so as to permit scanning of the channel.

To permit convenient erasing and rewriting of the lockout bit in the static RAM 124, one input of each of the AND gates 130B-130C is electrically connected to the output of NOR gate 132A through the inverter 134B, one input of the NOR gate 132A being electrically connected to conductor 88 to receive a zero when the band programming is not enabled and the other output being electrically connected to the output of NAND gate 131B to receive a binary zero when there is a lockout enabling pulse on conductor 86 and a pulse on a conductor 133 indicating the absence of a squelch in the absence of an auto scan pulse. The other input of AND gate 130B is electrically connected through the inverter 134A to conductor 120A and the other input of AND gate 130C is connected directly to conductor 120A so that when a binary one lock-out bit on the selected channel was in RAM 124, it results in a binary zero on one of the inputs to AND gate 130B and a binary one on one of the inputs to AND gate 130C and a reverse condition for a binary zero on the selected channel of the static RAM 124.

With these conditions, when the lockout bit is to be changed, a binary one is applied to one of the inputs of each of the AND gates 130B and 130C through the inverter 134B and if the channel is locked out, the other input of the AND gate 130C will receive a binary one and the other input of the AND gate 130B a binary zero whereas if the channel was not locked out, the other input of AND gate 130C will receive a binary zero and the other input of AND gate 130B will receive a binary one.

The write input of the static RAM 124 is electrically connected to the output of the NOR gate 132C, which has one input electrically connected to the output of AND gate 130C, another input electrically connected to the output of the AND gate 130A and a third input electrically connected to the output of the NOR gate 132B. One of the inputs of the NOR gate 132B is electrically connected to the output of the AND gate 130B and the other input is electrically connected to the output of the NOR gate 132C. With these connections, an output from the AND gate 130C indicating that a selecting channel was locked out and the change lockout bit energized results in a binary zero being applied to the write input of the first static RAM 124 from the NOR gate 132C and a binary zero from the output of the AND gate 130C and a binary one from the output of the AND gate 130B results in a binary one being applied to the static RAM to write a binary one into it. The first static RAM 124 is cleared by the output from the AND gate 130A. When the lockout bit changed, conductor 86 is energized and there is no band programming or squelch or auto scan pulse present.

While a circuit is shown in FIG. 4 which is able to both provide lockout signals and to provide band switching signals, it is possible to use only a circuit with band switching signals or lockout signals.

Figure 5:
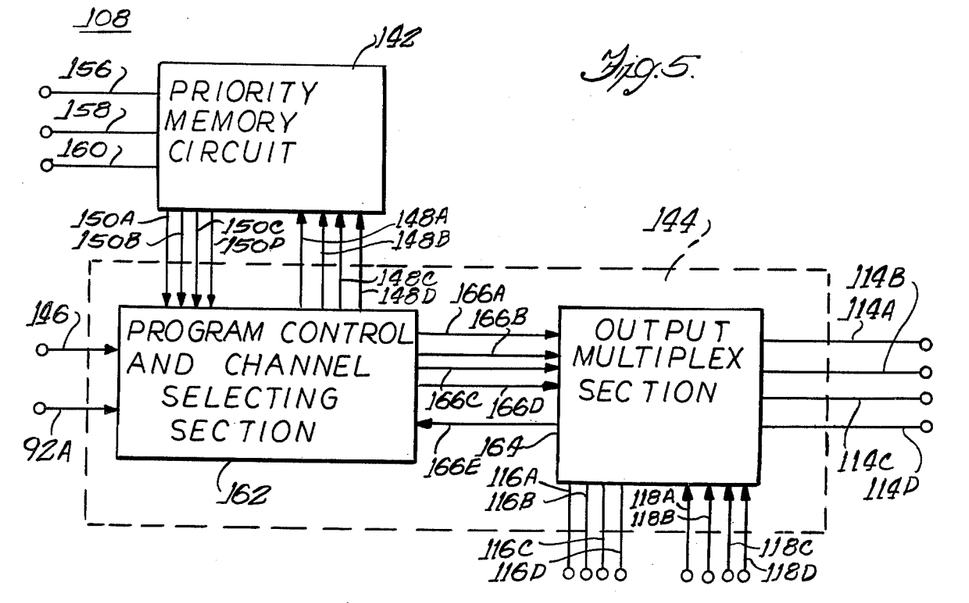
FIG. 5 is a block diagram of still another portion of the block diagram of FIG. 3.

In FIG. 5, there is shown a block diagram of the counter control and priority circuit 108 having a priority memory circuit 142 and a channel selecting and band switching logic circuit 144. The channel selecting and band switching logic circuit 144 receives clock pulses on conductor 92A and provides binary signals on conductors 114A-114D to the BCD to decimal decoder 112 (FIG. 3) for selecting channels 40A-40E (FIGS. 1 and 3). It also receives band switching signals on conductors 118A-118E and provides address signals to the program storage circuit (FIG. 3) on conductors 116A-116D. In the preferred embodiment, a channel capacity changing signal is applied to the channel selecting and band switching logic circuit 144 through a conductor 146 to select either sixteen channel or ten channel operation in a manner to be described hereinafter.

Signals from the second static RAM 126 (FIG. 4) over conductors 118A-118D change the normal order of scanning in accordance with the program recorded on the second static RAM 126 in embodiments in which band switching and changes in programs are desired.

To provide a priority channel to which the scanning receiver returns in accordance with a preset program each time scanning has been interrupted to receive a signal, the priority memory circuit 142 is electrically connected to the channel selecting and band switching logic circuit 144 through: (1) four channel address conductors 148A-148D to receive the address of selected channels; and (2) four channel selecting conductors 150A-150D to provide channel selecting signals to the channel selecting and band switching logic circuit 144 in accordance with priority requirements. To activate a priority control when the embodiment includes a priority mode conductor 156, a priority set conductor 158, and priority clock pulse conductor 160 are electrically connected to the priority memory circuit 142.

The priority set conductor 158 permits a particular channel to be selected within the priority memory circuit 142 and, any time there is an interruption of scanning, the scanning is resumed at that selected channel provided that the priority mode conductor 156 is energized. Otherwise, the scanning continues where it left off. A signal on the priority clock pulse conductor 160 changes the recorded priority channel to a new channel stepped to prior to the signal. Address conductors 148A-148D are utilized to set the priority channel and conductors 150A-150D control the priority operation.

The channel selecting and band switching logic circuit 144 includes a program control and channel selecting section 162 and an output multiplex section 164 connected by conductors 166A-166E, with the priority section of the program control and channel selecting section 162 being connected to the priority memory circuit 142 through conductors 150A-150D and 148A-148D for priority programming and with the output multiplex section 164 being connected to the program storage circuit 110 through conductors 116A-116D and 118A-118D.

The program control and channel selecting section 162 receives signals from the conductors 92A and 146 and applies signals through conductors 166A-166D to the output multiplex section 164, which, in turn, provides signals to the BCD to decimal decoder 112 (FIG. 4) through the conductors 114A-114D. Conductor 166E applies feedback signals from the output multiplex section 164 of the channel selecting and band switching logic circuit 144 to the program control and channel selecting section 162. Although the preferred embodiment includes both a programmable priority circuit and a programmable lockout circuit, both circuits are not necessary to each other and may be separated.

Figure 6:
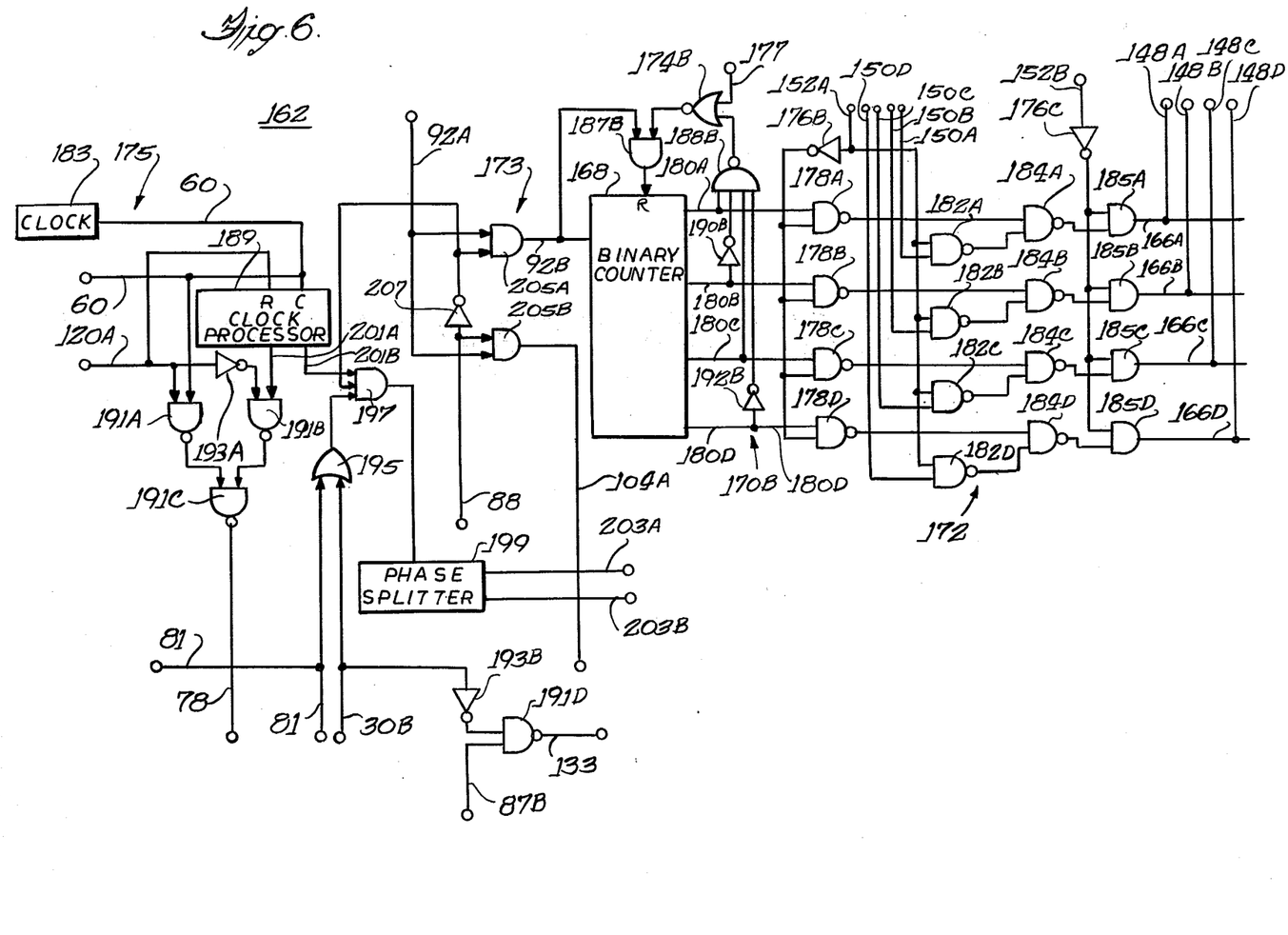
FIG. 6 is a logic circuit diagram of a portion of the block diagram of FIG. 5.

In FIG. 6, there is shown a logic circuit diagram of the program control and channel selecting section 162 including the binary counter 168, a channel number control circuit 170B, a channel priority control network 172, a programming gate circuit 173 and a timing control circuit 175. The four outputs of the binary counter 168 are each electrically connected to a different one of the four conductors 180A–180D.

To control the number of channels that are scanned, the channel number control circuit 170B includes a NOR gate 174B, a NAND gate 188B, two inverters 190B and 192B and an AND gate 187B. The NOR gate 174B has: (1) its output electrically connected to the reset terminal of the binary counter 168; (2) one input electrically connected to the output of NAND gate 188B to receive a signal from the outputs of the binary counter 168; and (3) its other input electrically connected to reset input conductor 177 to receive a signal when the channel capacity is to be changed.

To recognize when ten channels have been scanned, the NAND gate 188B has four inputs: (1) a first of which is connected to the conductor 180A representing the first bit position; (2) a second of which is connected to the output of the inverter 190B, the input of which is connected to conductor 180B representing the second bit position; (3) a third of which is connected to conductor 180C representing the third bit position; and (4) a fourth of which is connected to the output of the inverter 192B, the input of which is connected to conductor 180D representing the fourth bit position. With these connections, the NAND gate 188B applies a pulse to one input of the NOR gate 174B upon recognition of the tenth channel on the outputs of binary counter 168 that are connected and control the BCD to decimal decoder 112 which scans the channels 40A–40E (FIG. 3) through the channel priority control network 172 (FIG. 6) and the output multiplex section 164 (FIG. 5). One input of AND gate 187B is electrically connected to the output of NOR gate 174B and the other input is electrically connected to conductor 92B to apply an output pulse when there is a select ten pulse on conductor 177 and the tenth channel is recognized. The output of AND gate 187B is electrically connected to the reset terminal of binary counter 168 to reset the counter upon the clock pulse following the recognition of the tenth channel. When the ten select switch is not energized, the binary counter 168 is internally reset after the sixteenth channel.

To select a priority operation, the channel priority control network 172 includes twelve NAND gates 178A–178D, 182A–182D, and 184A–184D, four AND gates 185A–185D and two inverters 176B and 176C.

To generate a signal during a strobe pulse which is independent of the output of the binary counter 168 and yet represents the output of the binary counter at other times, the NAND gates 178A–178D each have one input electrically connected to conductor 152A through the inverter 176B to receive an enabling pulse upon the receipt of a carrier and to initiate the interrupt operation. The other inputs of the NAND gates 178A–178D are each electrically connected to a different one of the conductors 180A–180D, which are in turn electrically connected to different ones of the four outputs of the binary counter 168 in the order of increasing bit positions so that 180A is the lowest order bit position and 180D the highest order bit position.

To provide an indication of a priority bit during a strobe pulse, the four two-input NAND gates 182A–182D have one of the two inputs electrically connected to conductor 152A and the other input is electrically connected to a corresponding one of the conductors 150A–150D.

With these connections, the NAND gates 182A–182D receive strobe pulses from conductor 152A indicating a priority interrogation and receive on conductors 150A–150D the code representing a channel set for priority. The output of the AND gates 182A–182D provide an indication during the strobe pulse of the channel which has been set for priority, if any, and at other times and when no priority channel has been selected provide all binary one outputs.

To provide an output code indicating the code set in binary counter 168 when there is no interrogating strobe pulse for priority and to indicate either the absence of priority by binary zero outputs during a strobe pulse, NAND gates 184A–184D each have one of their two inputs electrically connected to the output of a corresponding one of the NAND gates 182A–182D and the other of the two inputs electrically connected to the output of the corresponding one of the NAND gates 178A–178D. The output of the NAND gates 184A–184D are electrically connected to one of the two inputs corresponding ones of the AND gates 185A–185D to provide code indications to these AND gates. The other input of each of the AND gates 185A–185D is electrically connected to conductor 152B through the inverter 176C to pass signals from the NAND gates 184A–184D except when the scanning receiver is scanning the alert channel which is the first channel by periodic clock pulses.

Thus, strobe pulses on conductor 152B provide an overriding scanning signal which will cause the receiver to lock on the weather alert channel regardless of any other signals whenever a signal is being broadcast on that channel. The output of the AND gates 185A–185D is electrically connected to a corresponding one of the conductors 166A–166D to apply to the output multiplex section 164 signals indicating the channel being scanned, the priority channel during programmable priority strobe pulses and all binary zeros when the weather alert channel is being interrogated by strobe pulses. The same signals are applied to conductors 148A–148D to interrogate the priority memory circuit 142 in a manner to be explained hereinafter (FIG. 5).

To provide basic timing signals, the timing control circuit 175 includes a 1.7 hertz clock 183, a clock processor 189, four NAND gates 191A–191D, two inverters 193A and 193B, an OR gate 195, an AND gate 197, and a phase splitter 199.

The basic 1.7 hertz clock pulses are generated by the clock 183 and applied through conductor 60 to the count input terminal of the clock processor 189 and to conductor 60 which is connected to the monostable multivibrator 56 (FIG. 2) in the manual stepping switch circuit 20 to time the output pulses on conductor 52 to the manual-automatic selector switching circuit 22. The clock processor 189 provides output pulses to conductors 201A and 201B, with the pulses applied to conductor 201A being of longer duration and being initiated prior to the pulses applied to conductor 201B, both conductors receiving pulses at 1.7 hertz.

The shorter pulses on conductor 201B are applied to one of three inputs to the AND gate 197, and eventually time the strobe pulses for the weather alert priority and the programmed priority. The longer pulses of conductor 201A are applied to one of the two inputs of NAND gate 191B and are eventually used for the timing of the channel scanning and programming scanning operations.

To provide a strobe signal to conductor 152A for testing for a programmable priority signal and a strobe signal to conductor 152B to test for a weather alert signal, the AND gate 197 has one of its three inputs electrically connected to conductor 88 through an inverter 207, a second of its inputs electrically connected to conductor 201B and a third of its inputs electrically connected to the output of OR gate 195. One of the inputs of OR gate 195 is connected to conductor 81 and the other is connected to conductor 30B so as to apply a positive signal to AND gate 197 in the presence of a squelch disable signal indicating the absence of a squelch, the absence of an automatic scan signal on conductor 87B from the inverter 80 (FIG. 2).

With these connections, the AND gate 197 applies a positive signal to its output upon the presence of a clock pulse on conductor 201B from the clock processor 189, the absence of a squelch signal or a signal indicating automatic scanning, and the absence of a signal indicating that programming is taking place. The output of the AND gate 197 is electrically connected to the phase splitter 199 which causes signals to be applied at different phases to conductors 203A-203B to strobe the programmable priority gates and the weather alert gates when electrically connected by the general programming switching circuit 18 (FIG. 1) to conductors 152A and 152B respectively.

To provide pulses to conductor 133 for reading of the lockout bits from the static RAM 124 (FIG. 4) one input of the NAND gate 191D is electrically connected to conductor 87B and the other is electrically connected to conductor 30B through the inverter 193B so that NAND gate 191D applies pulses to conductor 133 when there is no squelch signal and the equipment is being manually or automatically scanned.

To provide scanning pulses to conductor 78 to be controlled in the automatic or manual scan mode by the manual-automatic selector switch circuit 22 (FIG. 2), conductor 201A is electrically connected to one of the inputs of NAND gate 191B and the other of the two inputs of NAND gate 191B is electrically connected to conductor 120A through the inverter 193A so that pulses are applied to the output of NAND gate 191B whenever there is no lockout channel being scanned from the clock processor 189. NAND gate 191A has one of its inputs electrically connected to conductor 60 and the other of its inputs electrically connected to conductor 120A, conductor 120A also being connected to the reset input terminal of the clock processor 189.

Accordingly, the output of NAND gate 191A applies clock pulses at the rate of the clock 183 whenever there is a lockout bit present on conductor 120A and otherwise is closed. One of the inputs of NAND gate 191C is electrically connected to the output of NAND gate 191A and the other input of NAND gate 191C is electrically connected to the output of NAND gate 191B. Conductor 78 is electrically connected to the output of NAND gate 191C so as to receive pulses having the duration and frequency provided to conductor 120A from the clock processor whenever there is no lockout bit and receiving a faster pulse in resetting the clock processor 189 whenever there is a lockout bit.

To select the programming mode or the scanning mode of the scanning receiver, the programming gate circuit 173 includes two AND gates 205A and 205B and an inverter 207. Each of the AND gates 205A and 205B have one of their two inputs electrically connected to conductor 92A and AND gate 205B has its other input electrically connected to conductor 88 and AND gate 205A has its other input electrically connected to conductor 88 through the inverter 207 and is directly connected to one input of the AND gate 197. The output of AND gate 205A is electrically connected to conductor 92B to provide count pulses to the binary counter 168 during scanning of the scanning receiver and AND gate 205B has its output electrically connected to conductor 104A to provide counting pulses to the count input terminal of binary counter 122 (FIG. 4) and the read/write input terminal of the second static RAM 126 of the program storage circuit 110 (FIG. 3) to select the channels for programming of band information and lockout pulses during programming.

Figure 7:
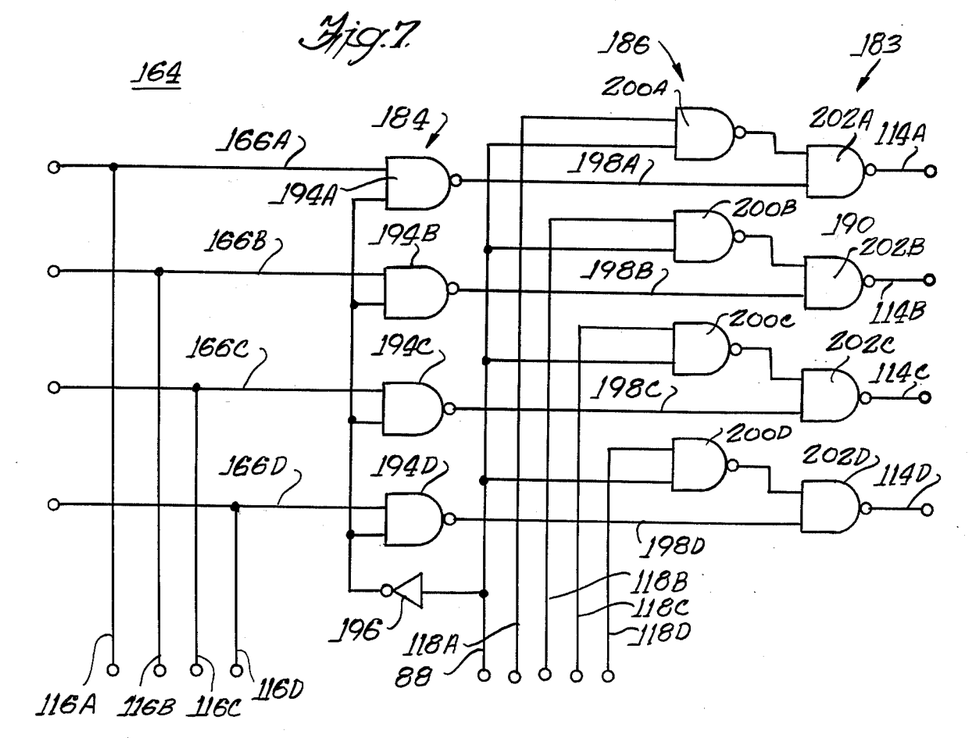
FIG. 7 is a logic circuit diagram of still another portion of the block diagram of FIG. 5.

In FIG. 7, there is shown a logic circuit diagram of the output multiplex section 164 of the channel selecting and band switching logic circuit 144 (FIG. 5) having a channel scan gating network 184, a band data gating network 186 and an output selecting gating network 183.

To pass encoded signals indicating the channel being scanned, the channel scan gating network 184 includes four two-input NAND gates 194A-194D and an inverter 196, with one of the two inputs of each of the NAND gates 194A-194D being electrically connected to the conductor 88 through the inverter 196 to receive an inverted program run signal from the program storage circuit 110 (FIGS. 4 and 7). The other inputs of the NAND gates 194A-194D are each connected to a corresponding one of the conductors 166A-166D to receive the channel scanning selecting signals from the program control and channel selecting section 162 of the channel (FIGS. 5 and 6).

The outputs at each of the NAND gates 194A-194D are connected to corresponding ones of the conductors 198A-198D to provide signals indicating channel selection during scanning and binary ones during programming since one input receives a binary zero from the inverter 196 during scanning and a binary one during programming.

To pass encoded signals indicating the bands and channels being programmed, the band data gating network 186 includes four NAND gates 200A-200D, with one input of the inputs of each of the NAND gates 200A-200D being electrically connected to the conductor 88 and the other input of each of the NAND gates being electrically connected to the corresponding one of the conductors 118A-118D to receive signals indicating channels or bands for programming. Each output of NAND gates 200A-200D is electrically connected to the output of a corresponding one of the NAND gates 202A-202D to apply a binary one thereto in the absence of a programming signal and to transmit signals on conductors 118A-118D thereto from the static RAM 126 in the presence of a programming signal on conductor 88.

To apply signals indicating the channel being scanned or the channel or band being programmed to conductors 114A-114D, the outputs of NAND gates 202A-202D are each electrically connected to a corresponding one of the conductors 114A-114D to provide pulses to the BCD to decimal decoder 112 (FIG. 3) under the control of signals from the NAND gates 200A-200D and 194A-194D each of which has its output electrically connected to one of the two inputs of corresponding ones of the NAND gates 202A–202D.

Figure 8:
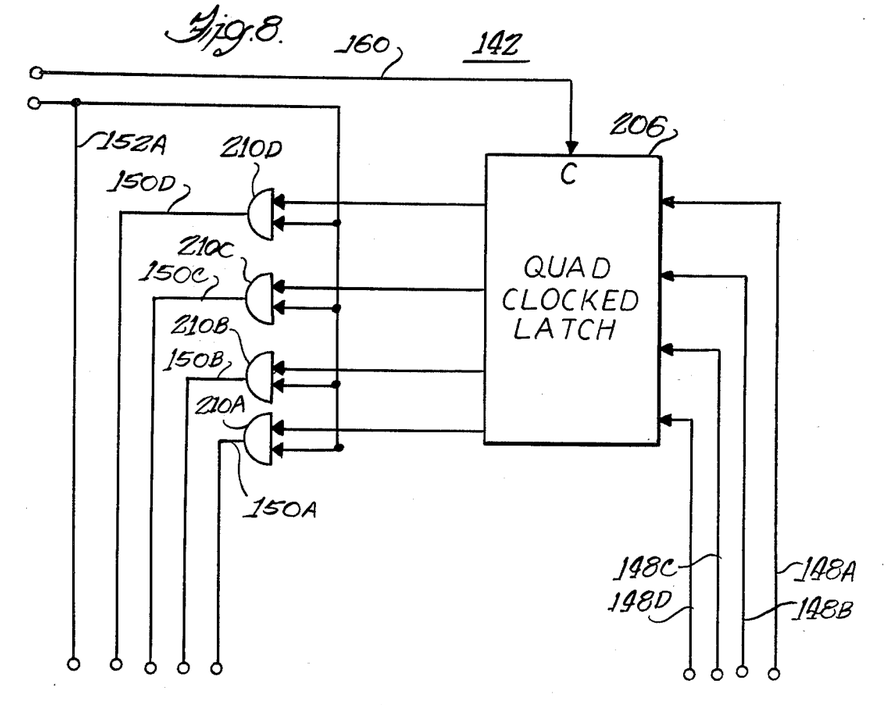
FIG. 8 is a logic circuit diagram of still another portion of the circuit of FIG. 5.

In FIG. 8, there is shown a logic circuit diagram of the priority memory circuit 142 having a quad-clocked latch 206, and four AND gates 210A–210D.

To receive signals corresponding to the addressed channel, the quad-clocked latch 206 is electrically connected to conductors 148A–148D which receive the signals from the program control and channel selecting section 162 (FIGS. 5 and 6). A conductor 160 is electrically connected to the clock input of the quad-clocked latch 206 to control the timing of its four inputs. The four outputs of the quad-clocked latch 206 are each electrically connected to one of the two inputs of a different one of the AND gates 210A–210D, the other input to each of the AND gates 210A–210D being electrically connected to conductor 152A which receives priority strobe signals, in the priority mode, which are also applied to inverter 176B (FIG. 6) in the program control and channel selecting section 162.

To select the priority channel for scanning during the priority strobe on conductor 152A, the priority selecting outputs are applied to the program control and channel selecting section 162 (FIG. 6) through conductors 150A–150D each of which is connected to the output of a corresponding one of the AND gates 182A–182D which receive the priority information from the quad-clocked latch 206. To set the quad-clocked latch 206 to a selected priority, the binary counter 168 is stepped to the selected channel and a pulse is applied to priority set conductor 160 in the programming mode.

Figure 9:
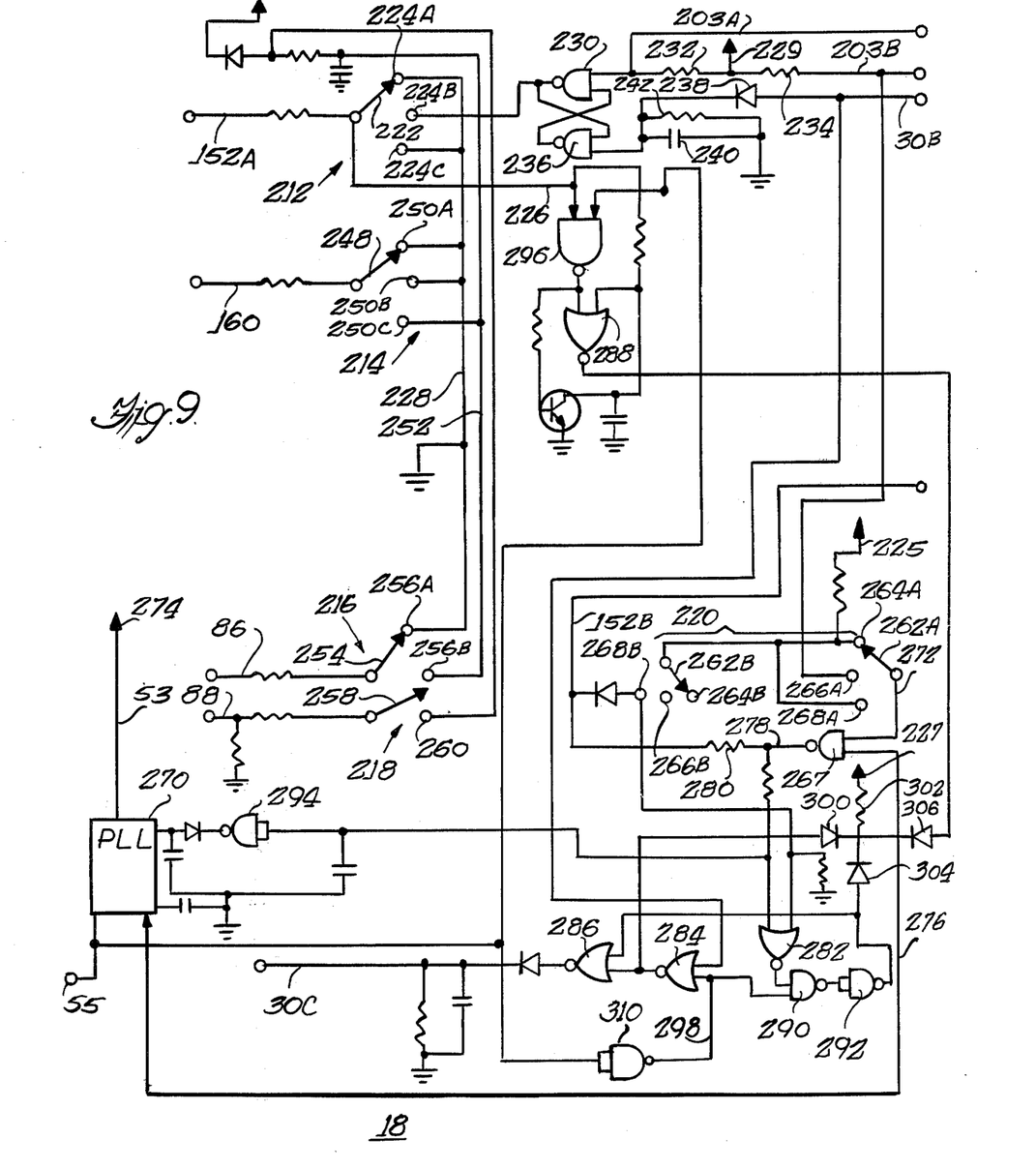
FIG. 9 is a schematic circuit diagram of a portion of the embodiment of FIG. 1.

In FIG. 9, there is shown a schematic circuit diagram of the programming switching circuit 18 having first and second single-pole three-position manually-operated gang switches 212 and 214, the single-pole double-throw switch 216, a single-pole single-throw switch 218, and a double-pole three-position switch 220.

To apply priority strobe pulses to conductor 152A when the scanning receiver is operating in the priority mode, the gang switch 212 includes a switch arm 222 and three fixed contacts 224A, 224B, and 224C. The switch arm 222 is electrically connected to conductor 152A through a resistor and to conductor 226. Stationary contact 224A is electrically connected to grounded conductor 228; stationary contact 224B is electrically connected to the output of NAND gate 230 to receive strobe pulses; and conductor 224C is electrically connected to ground conductor 228.

To apply strobe pulses to stationary contacts 224B, NAND gate 230 has one input electrically connected to conductor 203A to receive clock pulses, to conductor 203B through series connected resistors 232 and 234, the center of which is electrically connected to a source of positive potential 229 and has its other input electrically connected to the output of NAND gate 236. The NAND gate 236 has one input electrically connected to the output of NAND gate 230 and the other input electrically connected to conductor 30B to receive a squelch signal through the forward resistance of a diode 238 and to the parallel capacitor 240 and resistor 242 to delay the trailing edge of the squelch signal. With these connections, stationary contact 224B receives the split-phase clock pulses from the phase splitter 199 (FIG. 6) except in the presence of a squelch signal.

To apply a pulse to conductor 160 to change the priority channel set in the quad-clocked latch 206, the gang switch 214 includes a moveable switch arm 248 and three stationary contacts 250A–250C. Stationary contacts 250A and 250B are electrically connected to ground through the conductor 228 and contact 250C is electrically connected to a source of potential through conductor 252 to apply a positive pulse to conductor 160 with the switch arm 248 as closed against it.

To apply a positive pulse to conductor 86 so as to change the channel being addressed in the first static RAM 124 either to a lockout indication or to remove the lockout indication, the switch 216 includes a moveable switch arm 254 and two stationary contacts 256A and 256B. Contact 256A is grounded to conductor 228 and contact 256B is connected to a source of positive potential through conductor 252 so as to apply a positive pulse to conductor 86 when the switch arm 254 is closed against contact 256B.

To apply a positive pulse to conductor 88 to set the scanning receiver in the programming mode, the switch 218 includes a moveable switch arm 258 and a fixed contact 260. The contact 260 is electrically connected to a source of positive potential so that, when the switch arm 258 is connected against it, a positive pulse is applied to conductor 88.

To control the weather alert priority circuit, the switch 220 includes first and second switch arms 262A and 262B which are ganged together with switch arm 262A closing against fixed contacts 264A, 266A, and 268A and with switch arm 262B closing against fixed contacts 264B, 266B, and 268B.

To disable the weather alert priority, switch arms 262A and 262B are closed to fixed contacts 264A and 264B, thus providing a binary zero to conductor 152B to inactivate the weather alert priority from a NAND gate 267. For this purpose one input of the NAND gate 267 is electrically connected to the switch arm 262A by a conductor 272. The other of the two inputs of NAND gate 267 is electrically connected to the output of the tone decoder 270 so that the NAND gate 267 applies a binary zero to its output when the switch arm 262A is closed against contact 264A because of the positive potential applied to its input from source 225 but may provide a positive binary one output when receiving a signal from the tone decoder 270 when the switch arm 262A is in other positions. The tone decoder is not part of the invention and any conventional tone decoder may be used. The output of the NAND gate 267 is electrically connected to a conductor 278 which is connected to conductor 152B through a resistor 280 and to one input of NOR gate 282 through another resistor. A binary zero output on conductor 152B does not reset the scan control circuit 22 (FIG. 1).

To strobe the first channel for weather alert scanning and permit locking thereon during normal scanning and locked channel conditions when the switch arm 262A is closed against contact 266A and switch arm 262B is closed against 266B, the programming switching circuit 18 includes four NOR gates 282, 284, 286, and 288 and four NAND gates 290, 292, 294, and 296.

With switch arm 262A in contact with stationary contact 266A and switch arm 262B in contact with stationary contact 266B, priority clock pulses are applied through conductor 203B to one input of NAND gate 267 during automatic scanning causing pulses to be applied periodically to conductor 152B to open and close AND gates 185A–185D. These pulses are also applied to one input of NOR gate 282 and to both inputs of NAND gate 294 causing pulses to be applied through NAND gates 290 and 292 to the squelch delay circuit which includes NOR gates 286 and 284 and conductor 30C which delays scanning by the counter until noise from switching operations has stopped. The pulses on conductor 152B permit the priority channel to be sampled during manual scanning by resetting scan control circuit 14 to channel one and the pulses applied to one input of NOR gate 286 of the squelch delay circuit, permit scanning when a channel is locked on.

To permit silent interrogation of the weather alert priority when a signal is received on another channel, NAND gate 296 is electrically connected to NOR gate 288 and associated transistor, capacitor, and resistors to form a time-out blanking circuit whose output is summed through diode 306 to squelching transistor (not shown here) through resistor 302 to the source of power 227. In normal operation, squelching information is developed by NAND gate 290 which has one input electrically connected to NOR gate 282 which interprets inputs from switch arm 262B or from RC time delay after a logical one is sustained on the output of NAND gate 267 and its other input electrically connected to NOR gate 284 which has one input influenced by the logical condition on conductor 298 and its other input influenced by squelching on conductor 30B. The output of NAND gate 290 which is inverted by NAND gate 292 and the output of NOR gate 284 are summed twice, first through diode 304 and diode 300 respectfully together with the blanker input (mentioned above) through diode 306 to squelching transistor as above and secondly they are summed and inverted by NOR gate 286 whose output is applied to a squelch delay circuit consisting of a diode, resistor, and a capacitor and applied to conductor 30C.

With these conditions, NOR gate 286 receives two binary zeros only when the weather warning alert is not recognized by tone decoder 270 on channel one during a strobe pulse on conductor 152B and a ground level output from NAND gate 292 indicating the weather alert clock pulse time or when a squelch signal is recognized during automatic scanning or, thus enabling a priority signal for the weather alert to override a channel that has been locked onto.

To provide a signal to conductor 298 when a channel is active, conductor 55 is electrically connected through inverter 310 to conductor 298 so that, when channel one is energized conductor 298 applies the binary one to one of the inputs of NOR gate 284 and when it is de-energized applies a binary zero to the input of NOR gate 284.

As can be understood from the above description, a scanning radio of this invention has the advantages of: (1) providing lockout operations at low cost, with reliable components, low power consumption and small size; (2) permitting other kinds of switching operations using some of the same circuits as the lockout circuit; and (3) permitting a flexible priority system.

Although a specific embodiment has been described with particularity, many modifications and variations in the specific embodiment may be made without deviating from the invention. Accordingly, it is to be understood, that within the scope of the appended claims, the invention may be practiced other than as specifically described.

What is claimed is:

1. Radio apparatus comprising:
   radio frequency means for receiving radio frequency energy;
   signal processing means for selecting certain wavelengths of said radio frequency energy and for producing audio intelligence from said wavelengths of radio frequency energy;
   said signal processing means including mixer means for converting radio frequency energy to lower frequency energy;
   control means for selecting the frequency of radio frequency energy that is to be converted to lower frequency energy;
   said control means including oscillator means for repeatedly generating a series of selected frequencies from a plurality of different frequency local oscillations for transmission to said mixer means, whereby a plurality of frequencies are repeatedly scanned and signal means for generating a series of control signals differentiating between each of said different frequency local oscillations to be transmitted to said mixer means and certain other of said plurality of frequencies in each scan;
   programming means for generating programming signals representing at least one programmed frequency in said series of frequencies of a scan;
   said signal means including control-signal means for changing said control signals in response to said programming signals whereby different frequencies of said plurality of different frequencies in a scan are applied to said mixer means; and
   said control signal means including memory means for recording said programming signals and read means for reading said programming signals from said memory means at least as soon as said control signal generating means generates a control signal representing said programmed frequency in said scan.

2. Radio apparatus according to claim 1 in which said programming means includes means for changing said programming signals manually.

3. Radio apparatus according to claim 2 in which said recording includes means for recording a signal corresponding to a frequency selected to be locked out, whereby said scanning receiver may be moved to said frequency manually and said signal recorded to lock out said frequency.

4. Radio apparatus according to claim 3 in which said control means includes a clock and a manual switch electrically connected between said signal means and said clock.

5. Radio apparatus according to claim 4 in which said programming means includes means indicating an address of the selected frequency and said memory means includes an addressable memory, addressable to the means indicated by said addressing means and a means for reading information from said memory and writing information into said memory.

6. Radio apparatus according to claim 5 in which said memory is a static RAM.

7. Radio apparatus according to claim 6 in which said memory means further includes means for recording other switching operations for said control means.

8. Radio apparatus according to claim 1 in which said recording includes means for recording a signal corresponding to the frequency selected to be locked out, whereby said scanning receiver may be moved to said frequency manually and said signal recorded to lock out said frequency.

9. Radio apparatus according to claim 8 in which said control means includes a clock and a manual switch electrically connected between said signal means and said clock.

10. Radio apparatus according to claim 9 in which said programming means includes means indicating an address of the selected frequency and said memory means includes an addressable memory, addressable to the means indicated by said addressing means and a means for reading information from said memory and writing information out of said memory.

11. Radio apparatus according to claim 10 in which said memory is a static RAM.

12. Radio apparatus according to claim 11 in which said memory means further includes means for recording other switching operations for said control means.

13. Radio apparatus according to claim 1 in which said control means includes a clock and a manual switch electrically connected between said signal means and said clock.

14. Radio apparatus according to claim 13 in which said programming means includes means indicating an address of the selected frequency and said memory means includes an addressable memory, addressable to the means indicated by said addressing means and a means for reading information from said memory and writing information out of said memory.

15. Radio apparatus according to claim 14 in which said memory is a static RAM.

16. Radio apparatus according to claim 15 in which said memory means further includes means for recording other switching operations for said control means.

17. Radio apparatus according to claim 1 in which said programming means includes a means for generating a priority channel program signal and said control means includes means for returning to said channel after an interrupt.

* * * * *